US010629382B2

(12) United States Patent
Galisultanov et al.

(10) Patent No.: US 10,629,382 B2
(45) Date of Patent: Apr. 21, 2020

(54) GALVANIC ISOLATION COUPLING DEVICE

(71) Applicant: Commissariat à l'Énergie Atomique et aux Énergies Alternatives, Paris (FR)

(72) Inventors: Ayrat Galisultanov, Grenoble (FR); Hervé Fanet, Revel (FR); Yann Perrin, Grenoble (FR); Gaël Pillonnet, Proveysieux (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/053,521

(22) Filed: Aug. 2, 2018

(65) Prior Publication Data

US 2019/0043671 A1    Feb. 7, 2019

(30) Foreign Application Priority Data

Aug. 3, 2017    (FR) ..................... 17 57469

(51) Int. Cl.
| | |
|---|---|
| *H01G 5/16* | (2006.01) |
| *H01G 5/011* | (2006.01) |
| *H01G 5/013* | (2006.01) |
| *H03K 3/0231* | (2006.01) |
| *H02J 50/05* | (2016.01) |
| *H02M 3/36* | (2006.01) |

(52) U.S. Cl.
CPC .............. *H01G 5/16* (2013.01); *H01G 5/011* (2013.01); *H01G 5/0136* (2013.01); *H02J 50/05* (2016.02); *H03K 3/0231* (2013.01); *H02M 3/36* (2013.01)

(58) Field of Classification Search
None
See application file for complete search history.

(56) References Cited

U.S. PATENT DOCUMENTS 6,611,168 B1 * 8/2003 Denison ................. H01G 5/16
330/4.5
2006/0018082 A1    1/2006 Yamagata et al.
(Continued)

FOREIGN PATENT DOCUMENTS

| EP | 3182590 A1 | 6/2017 |
|---|---|---|
| JP | 2007/236182 A | 9/2007 |

OTHER PUBLICATIONS

French Search Report dated Apr. 3, 2018 in connection with Application No. FR 17/57469.

*Primary Examiner* — Cassandra F Cox
(74) *Attorney, Agent, or Firm* — Wolf, Greenfield & Sacks, P.C.

(57) ABSTRACT

A system including first and second electric or electronic circuits galvanically isolated from each other, and a coupling device coupling the first circuit to the second circuit, the coupling device including a variable-capacitance capacitor including first and second electrodes mobile with respect to each other, separated by an insulating region, and third and fourth electrodes electrically insulated from the first and second electrodes, capable of receiving a control signal to vary, by an electrostatic, electromagnetic, or piezoelectric actuation mechanism, the relative position of the first and second electrodes, to vary the capacitance between the first and second electrodes.

9 Claims, 3 Drawing Sheets

(56) References Cited

U.S. PATENT DOCUMENTS

2014/0055908 A1* 2/2014 Murata .................... H01G 5/16
361/290
2014/0225793 A1 8/2014 Ikemoto et al.
2018/0366272 A1* 12/2018 Pillonnet ................ H01G 5/011

* cited by examiner

GALVANIC ISOLATION COUPLING DEVICE

This application claims the priority benefit of French patent application number 17/57469, filed on Aug. 3, 2017, the entire contents of which is hereby incorporated by reference in its entirety to the maximum extent allowable.

BACKGROUND

The present disclosure generally relates to electric and electronic circuits, and more particularly aims at a galvanic isolation coupling device.

DISCUSSION OF THE RELATED ART

A galvanic isolation coupling device is a device which enables to transmit electric data or power supply signals between two electric or electronic circuits which are not directly coupled to each other by a conductive element.

Known galvanic isolation coupling devices comprise magnetic transformers, coupling capacitors, piezoelectric transformers, and optocouplers.

Known galvanic isolation coupling devices however have certain limitations. In particular, in a magnetic transformer, a tradeoff has to be made between the coupling coefficient between the input and output signals, the isolation rate (that is, the ability to resist different voltage levels between the input circuit and the output circuit), and the parasitic capacitances between the spirals of the primary and secondary windings of the transformer. In the case where the galvanic isolation is achieved by means of coupling capacitors, a tradeoff has to be found between the signal transmission speed and the immunity to the common modes of the primary and of the secondary. An optocoupler enables to avoid having parasitic capacitances between the primary and the secondary but has the disadvantage of not being bidirectional. Piezoelectric transformers have the disadvantage of being relatively expensive, and of having a relatively low isolation rate due to the low voltage resistance of piezoelectric materials.

It would thus be desirable to have an alternative solution to known galvanic isolation coupling devices.

SUMMARY

Thus, an embodiment provides a system comprising first and second electric or electronic circuits galvanically isolated from each other, and a coupling device coupling the first circuit to the second circuit, the coupling device comprising a variable-capacitance capacitor comprising first and second electrodes mobile with respect to each other, separated by an insulating region, and third and fourth electrodes electrically insulated from the first and second electrodes, capable of receiving a control signal to vary, by an electrostatic, electromagnetic, or piezoelectric actuation mechanism, the relative position of the first and second electrodes, to vary the capacitance between the first and second electrodes.

According to an embodiment, the coupling device comprises first and second input terminals connected to the first circuit and capable of receiving an input signal originating from the first circuit, and first and second output terminals connected to the second circuit and galvanically isolated from the first and second input terminals, capable of supplying the second circuit with an output signal which is an image of the input signal.

According to an embodiment, the first and second input terminals are respectively connected to the third and fourth electrodes of the capacitor.

According to an embodiment, the first and second output terminals are coupled to the first and second electrodes of the capacitor so that the output signal varies according to the value of the capacitance between the first and second electrodes.

According to an embodiment, the input signal is an AC signal, the coupling device comprising a circuit capable of applying a constant voltage between the first and second electrodes of the capacitor, and of supplying a voltage proportional to the current generated on the second electrode of the capacitor due to the variations of the capacitance between the first and second electrodes of the capacitor.

According to an embodiment, the circuit of the coupling device comprises:
  a voltage source capable of applying a first constant DC voltage onto the first electrode of the capacitor;
  an operational amplifier having its negative input connected to the second electrode of the capacitor;
  a voltage source capable of applying a second constant DC voltage onto the positive input of the operational amplifier; and
  a resistor coupling the negative input of the operational amplifier to the output of the operational amplifier.

According to an embodiment, the input signal is an AC or DC signal, the coupling device comprising an oscillator capable of supplying a voltage having a frequency which is a function of the value of the capacitance between the first and second electrodes of the capacitor.

According to an embodiment, the oscillator comprises a hysteresis comparator arranged to compare the voltage between the first and second electrodes of the capacitor with a first threshold and with a second threshold lower than the first threshold, and to order the application of a constant discharge current between the first and second electrodes of the capacitor when said voltage reaches the first threshold, and the application of a constant charge current between the first and second electrodes of the capacitor when said voltage reaches the second threshold.

According to an embodiment, the coupling device further comprises:
  an additional variable-capacitance capacitor comprising first and second electrodes mobile with respect to each other, separated by an insulating region, and third and fourth electrodes electrically insulated from the first and second electrodes, capable of receiving a control signal to vary, by an electrostatic, electromagnetic, or piezoelectric actuation mechanism, the relative position of the first and second electrodes to vary the capacitance between its first and second electrodes;
  a voltage source capable of applying a DC reference voltage between the third and fourth electrodes of the additional capacitor;
  an additional oscillator capable of supplying a voltage having a frequency which is a function of the value of the capacitance between the first and second electrodes of the additional capacitor; and
  a phase-locked loop capable of supplying a signal representative of the frequency difference between the voltage supplied by the oscillator and the voltage supplied by the additional oscillator.

According to an embodiment, the first circuit is powered under a voltage which is at least ten times smaller or at least ten times greater than that of the second circuit.

According to an embodiment, the first, second, third, and fourth electrodes of the capacitor are coated with a layer made of an insulating material.

According to an embodiment, the insulating material is parylene.

The foregoing and other features and advantages will be discussed in detail in the following non-limiting description of specific embodiments in connection with the accompanying drawings.

DETAILED DESCRIPTION

The same elements have been designated with the same reference numerals in the different drawings. For clarity, only those steps and elements which are useful to the understanding of the described embodiments have been shown and are detailed. In particular, the electric or electronic circuits capable of being coupled together by the described galvanic isolation coupling devices have not been detailed, since the described coupling devices may be used in any system comprising two electric or electronic circuits not connected to each other, that is, not directly coupled by a conductive element, for example, two circuits powered with voltages of different levels and having different reference terminals or grounds, to transmit electric data or powers supply signals between the two circuits. As an example, the galvanic isolation coupling devices described hereafter may be used to control electronic power components such as transistors, thyristors, triacs, etc. or to form an insulated power supply circuit. In the following description, when reference is made to terms qualifying relative positions, such as terms "above", "under", "upper", "lower", etc., or to terms qualifying directions, such as terms "horizontal", "vertical", etc., it is referred to the orientation of the drawings, it being understood that, in practice, the described devices may be oriented differently. The terms "approximately", "substantially", and "in the order of" are used herein to designate a tolerance of plus or minus 10%, preferably of plus or minus 5%, of the value in question.

European patent application No 16204534.8 (B14590/DD16568), filed on Dec. 15, 2016, describes embodiments of logic circuits based on electromechanical variable-capacitance capacitors comprising two main electrodes separated by an insulating region, and two control electrodes electrically insulated from the main electrodes and capable of receiving a control signal to vary the capacitance between the main electrodes.

Figure 1:
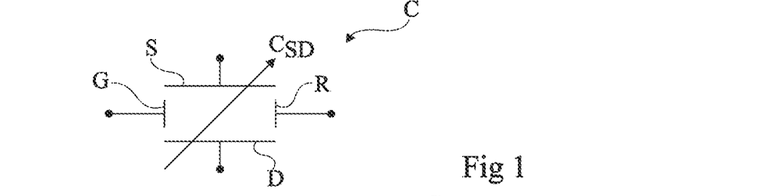
FIG. 1 is an electric diagram of a variable-capacitance capacitor with four electrodes.

FIG. 1 is an electric diagram of such a capacitor, designated with reference C in the drawing. In FIG. 1, the main electrodes are designated with references S and D, and the control electrodes are designated with references R and G. Main electrodes S and D are mobile with respect to each other and capacitance CSD between main electrodes S and D is a function of the relative position of electrodes S and D. The control signal applied between electrode R and G enables to vary the relative position of electrodes S and D, to vary capacitance CSD. The actuation of capacitor C may be of electrostatic type, as for example described in relation with FIGS. 16A, 16B, 17A, 17B, and 18 of above-mentioned European patent application No 16204534.8, or of electromagnetic type such as for example described in relation with FIG. 19 of above-mentioned European patent application No 16204534.8.

Other embodiments of variable-capacitance capacitors with four electrostatically or electromagnetically actuated electrodes are described in French patent application No 17/55419 (B15834/DD17806) filed on Jun. 15, 2017. Such capacitors particularly have the specificity that for at least one configuration of the capacitor, the value of the capacitance CSD formed between main electrodes S and D of the capacitor is independent from the voltage VSD applied between said main electrodes. To achieve this, the capacitor comprises a system for controlling the position of electrode D relative to electrode S, this system being arranged so that, for at least one relative position of electrode D relative to electrode S, the position of electrode D relative to electrode S is independent from voltage VSD applied between electrodes S and D. As an example, electrode S comprises two first substantially parallel conductive plates electrically connected to each other, and electrode D comprises a second conductive plate which is substantially parallel to the first conductive plates and arranged between the first conductive plates, and the control system is an electrostatic system such that, for at least one position of electrode D relative to electrode S, the electrostatic force exerted on the second conductive plate by one of the first conductive plates compensates for the electrostatic force exerted on the second conductive plate by the other first conductive plate.

Examples of electrostatically actuated variable-capacitance capacitors are further described in patent EP0986077 and in the corresponding patent application U.S. Pat. No. 6,242,989.

According to an aspect of an embodiment, it is provided to form a galvanic isolation coupling device from an electrostatically or electromagnetically actuated variable-capacitance capacitor. More particularly, advantage is here taken from the fact that the value of capacitance CSD between main electrodes S and D is a function of a control signal applied between control electrodes G and R, and that electrodes S and D are electrically insulated from electrodes G and R, to perform a galvanic isolation coupling device.

Figure 2:
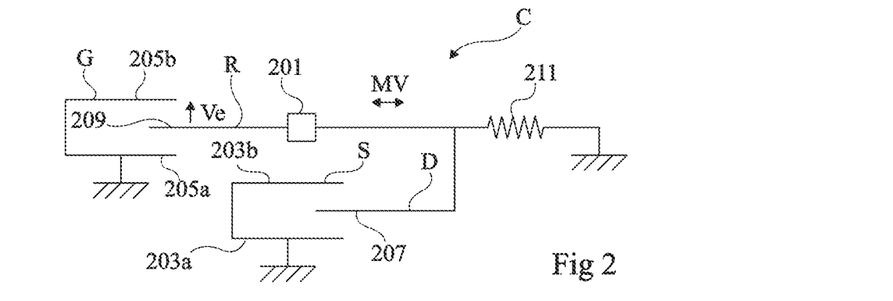
FIG. 2 is a simplified cross-section view of an embodiment of an electrostatically actuated variable-capacitance capacitor with four electrodes.

FIG. 2 is a simplified cross-section view of an embodiment of an electrostatically-actuated variable-capacitance capacitor C with four electrodes that can be used to form a galvanic isolation coupling device.

Capacitor C comprises two assemblies mobile with respect to each other, hereafter respectively called fixed assembly and mobile assembly. All the elements of the fixed assembly are fixed with respect to one another, and all the elements of the mobile assembly are fixed with respect to one another. In FIG. 2, a mechanical mass having all the elements of the fixed assembly attached thereto has been shown with oblique hatchings.

Figure 3:
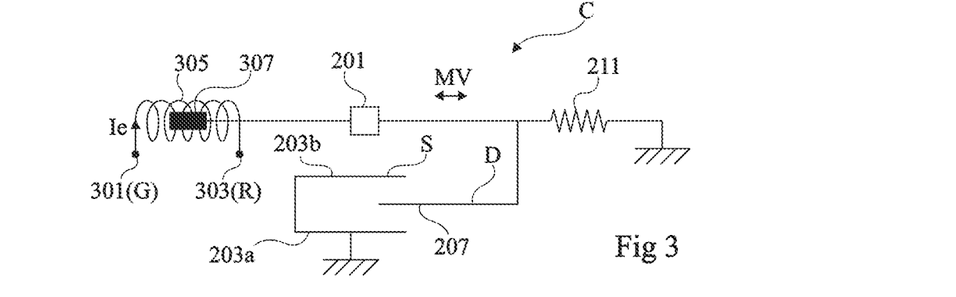
FIG. 3 is a simplified cross-section view of an embodiment of an electromagnetically actuated variable-capacitance capacitor with four electrodes.

In the example of FIG. 2, electrodes S and G form part of the fixed assembly, and electrodes D and R form part of the mobile assembly. The square bearing reference numeral 201 in FIG. 3 represents an electrically-insulating region of the mobile assembly, which electrically insulates electrode D from electrode R.

Electrode S comprises two substantially horizontal conductive plates 203a and 203b facing each other (that is, substantially confounded in vertical projection), mechanically fastened to each other and electrically connected to each other. Electrode G comprises two substantially horizontal conductive plates 205a and 205b facing each other, mechanically fastened to each other and electrically connected to each other but electrically insulated from conductive plates 203a and 203b. Electrode D comprises a substantially horizontal conductive plate 207, electrically insulated from conductive plates 203a, 203b, 205a, and 205b and mobile with respect to conductive plates 203a, 203b, 205a, and 205b. Electrode R comprises a substantially horizontal conductive plate 209, mechanically fastened to conductive plate 207 but electrically insulated from plate 207 by insulating region 201. It should be noted that in the present description, conductive plate means a plate made of a material capable of conducting electric charges, which material may be a conductive material, for example, a metal, or also a semiconductor material, for example, silicon.

In this example, the fixed assembly and the mobile assembly are arranged so that conductive plates 207 and 209 are respectively arranged:

between conductive plates 203a and 203b, at least partially opposite conductive plates 203a and 203b, substantially at an equal distance from conductive plates 203a and 203b; and between conductive plates 205a and 205b, at least partially opposite conductive plates 205a and 205b, substantially at an equal distance from conductive plates 205a and 205b.

In this example, the mobile assembly is free to displace according to a single degree of liberty in horizontal translation (parallel to conductive plates 203a, 203b, 207, 205a, 205b, 209) with respect to the fixed assembly, to modify the surface area of mobile conductive plate 207, respectively 209, opposite the corresponding fixed conductive plates 203a and 203b, respectively 205a and 205b, without modifying the distance between each mobile conductive plate and the corresponding fixed conductive plates (motion represented by a double arrow MV in the drawing). More particularly, in the example of FIG. 2, the fixed assembly and the mobile assembly are arranged so that when the surface area of any of mobile conductive plates 207 and 209 opposite the corresponding fixed conductive plates 203a and 203b, respectively 205a and 205b, increases, the surface area of the other mobile conductive plates opposite the corresponding fixed conductive plates increases, and conversely.

The capacitor C of FIG. 2 further comprises pull-back means, for example, a return spring 211 coupling the mobile assembly to the fixed assembly, arranged to, in the absence of any electric biasing of the electrodes, take back the mobile assembly to a position (relative to the fixed assembly) called idle position, for example, a position when mobile conductive plates 207 and 209 are only partially opposite the corresponding fixed conductive plates 203a and 203b, respectively 205a and 205b (for example, the position shown in FIG. 2).

At the first order, capacitance CSD of capacitor C between its main electrodes S and D is proportional to the surface area of conductive plate 207 opposite conductive plates 203a and 203b.

When a non-zero voltage Ve is applied between control electrodes G and R of the capacitor, mobile conductive plate 209 is attracted between the corresponding fixed conductive plates 205a and 205b by electrostatic interaction. This causes a horizontal displacement of the mobile assembly with respect to the fixed assembly, tending to increase the surface area of mobile conductive plate 209 opposite the corresponding fixed conductive plates 205a and 205b and, accordingly, the surface area of mobile conductive plate 207 opposite fixed conductive plates 203a and 203b. Capacitance CSD of capacitor C thus tends to increase. A decrease (in absolute value) of the control voltage applied between electrodes G and R conversely results in taking the mobile assembly back to its idle position, and thus in taking capacitance CSD back to its initial value.

FIG. 3 is a simplified cross-section view of an embodiment of an electromagnetically actuated variable-capacitance capacitor C with four electrodes which can be used to form a galvanic isolation coupling device.

The capacitor C of FIG. 3 mainly differs from the capacitor C of FIG. 2 in that in the example of FIG. 3, conductive plates 205a, 205b, and 209 are replaced with an assembly comprising:

a conductive terminal 301, corresponding to electrode G of the capacitor;

a conductive terminal 303, corresponding to electrode R of the capacitor;

a conductive terminal 305 having a first end electrically connected to terminal 301 and having a second end electrically connected to terminal 303; and a magnet 307 arranged inside of coil 305.

In this example, terminals 301 and 303 and coil 305 belong to the fixed assembly of the capacitor, and magnet 307 is an element of the mobile assembly of the capacitor. In other words, terminals 301 and 303 and coil 305 are fixed with respect to conductive plates 301a, 301b, 305a, and 305B, and magnet 307 is fixed with respect to conductive plate 207. Magnet 307 is for example (but not necessarily) electrically insulated from conductive plate 207. In this example, the central axis of coil 305 is substantially horizontal.

The application of a control current Ie in coil 305 via electrodes G and R causes a displacement of magnet 307 along the central axis of the coil. This results in a variation of the surface area of mobile conductive plate 207 opposite fixed conductive plates 203a and 203b, and thus in a variation of capacitance CSD of capacitor C.

More generally, other structures of electrostatically or electromagnetically actuated variable-capacitance capacitors with four electrodes, for example, structures of the type described in above-mentioned European patent application No 16204534.8 and French patent application No 17/55419, may be used to form a galvanic isolation coupling device.

Preferably, and although this is not detailed in FIGS. 2 and 3, each of the four electrodes of the capacitor is coated with a protective layer made of an insulating material, for example, an insulating polymer, for example, parylene. As an example, the insulating material is sprayed on all the conductive portions of capacitor C and particularly on its electrodes at the end of the capacitor manufacturing method. This enables to increase the voltage behavior of the capacitor, since the breakdown voltage of the insulating material is greater than that of air.

Figure 4:
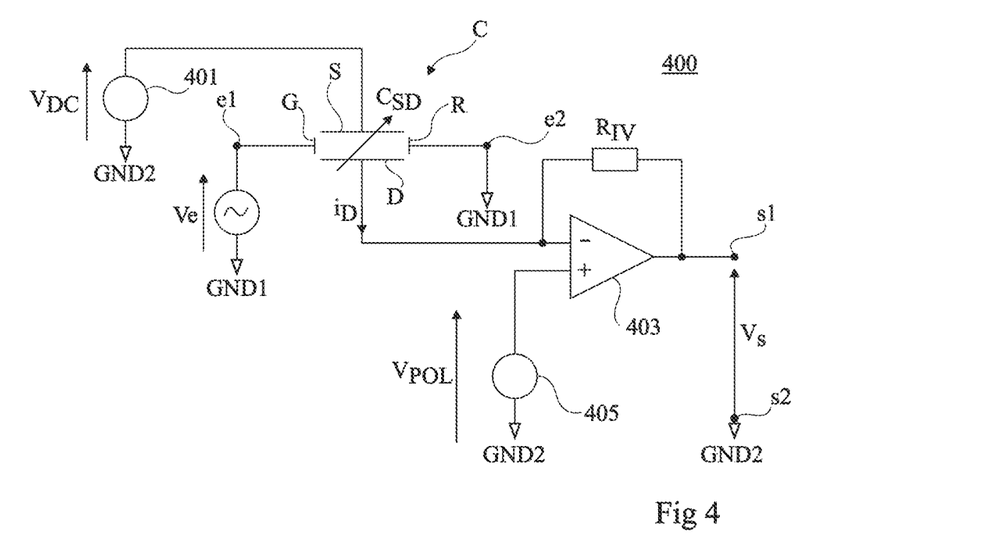
FIG. 4 is an electric diagram of an example of a galvanic isolation coupling device according to an embodiment.

FIG. 4 is an electric diagram of an example of a galvanic isolation coupling device 400 according to an embodiment.

The device of FIG. 4 comprises a variable-capacitance capacitor with four electrodes, for example, a capacitor of the type described in relation with FIG. 2.

The coupling device of FIG. 4 is capable of receiving an AC input voltage Ve applied between input terminals e1 and e2 of the device, and of supplying an AC output voltage Vs which is an image of voltage Ve, between output terminals s1 and s2 of the device. Input terminals e1 and e2 are galvanically isolated from output terminals s1 and s2, that is, there is no conductive connection between them. As an example, voltage Ve is supplied by a first electric or electronic circuit (not shown in the drawing) connected to input terminals e1 and e2 of the coupling device, and voltage Vs is applied to a second electric or electronic circuit (not shown in the drawing) connected to the output terminals of the coupling device, no conductive connection being provided between the first and second circuits. As an example, the first and second circuits are powered with voltages of different levels and have different reference terminals or grounds.

In this example, input terminals e1 and e2 of the coupling device are respectively connected to electrodes G and R of capacitor C. As an example, terminal e2 is connected to a terminal GND1 of application of a reference potential of the first circuit, for example, the ground of the first circuit, input terminal Ve delivered by the first circuit being referenced to terminal GND1.

The coupling device of FIG. 4 comprises a circuit capable of setting to a constant value the voltage between electrodes S and D of capacitor C, and of supplying a voltage Vs proportional to the current between electrodes S and D of the capacitor.

More particularly, in this example, the coupling device comprises a first DC voltage source 401 applying a constant voltage VDC on electrode S of capacitor C. Voltage VDC is referenced to a terminal GND2 of application of a reference potential of the second circuit, for example, the ground of the second circuit. The coupling device of FIG. 4 further comprises an operational amplifier 403 having a negative input terminal (−) connected to electrode D of capacitor C, and a positive input terminal (+). The coupling device of FIG. 4 further comprises a second DC voltage source 405 applying a constant voltage VPOL onto the positive input terminal (+) of operational amplifier 403. Voltage VPOL is referenced to terminal GND2. The coupling device of FIG. 4 further comprises a resistor RIV coupling the negative input (−) of operational amplifier 403 to an output node of operational amplifier 403. Output terminals s1 and s2 of the coupling device are respectively connected to the output terminal of operational amplifier 403 and to terminal GND2. In other words, output voltage Vs of the coupling device of FIG. 4 is the output voltage of operational amplifier 403, referenced to terminal GND2.

The coupling device of FIG. 4 operates as follows. When an AC input voltage Ve is applied between input terminals e1 and e2, the value of capacitance CSD between main electrodes S and D of capacitor C follows the variations of voltage Ve. Operational amplifier 403 enables to maintain a DC bias voltage (voltage VPOL, referenced to node GND2) on electrode D of capacitor C. Thus, voltage VSD between main electrodes S and D of capacitor C is maintained at a constant value, substantially equal to VDC-VPOL. Operational amplifier 403 further enables to convert into voltage the current iD generated on electrode D of capacitor C.

Current iD can be expressed as follows:

$$i_D = \left(C_{SD}\frac{dV_{SD}}{dt}\right)_{C_{SD}=cst} + \left(V_{SD}\frac{dC_{SD}(Ve)}{dt}\right)_{V_{SD}=V_{DC}-V_{POL}}$$

The first term of the above equation may be considered as zero, voltage VSD being substantially constant. Current iD is then only linked to the time variation of capacitance CSD, itself linked to the time variation of input voltage Ve. Output voltage Vs of the coupling device is linked to current iD by the following equation:

$$V_s = R_{IV} * I_D = R_{IV} * V_{SD}\frac{dC_{SD}(Ve)}{dt}$$

Output voltage Vs of the coupling device thus is an image of input voltage Ve. The galvanic isolation is ensured by the variable-capacitance capacitor with four electrodes, particularly via the insulating region separating electrode D from electrode R (element 201 of the mobile assembly in the example of FIG. 2). Thus, the power supply voltage of the input circuit (supplying voltage Ve) may be different from the power supply voltage of the output circuit (receiving voltage Vs). As an example, the power supply voltage of the input circuit is at least 10 times greater than or at least 10 times smaller than the power supply voltage of the output circuit. Further, the reference potentials present on terminal GND1 of the input circuit and on terminal GND2 of the output circuit may be different.

Figure 5:
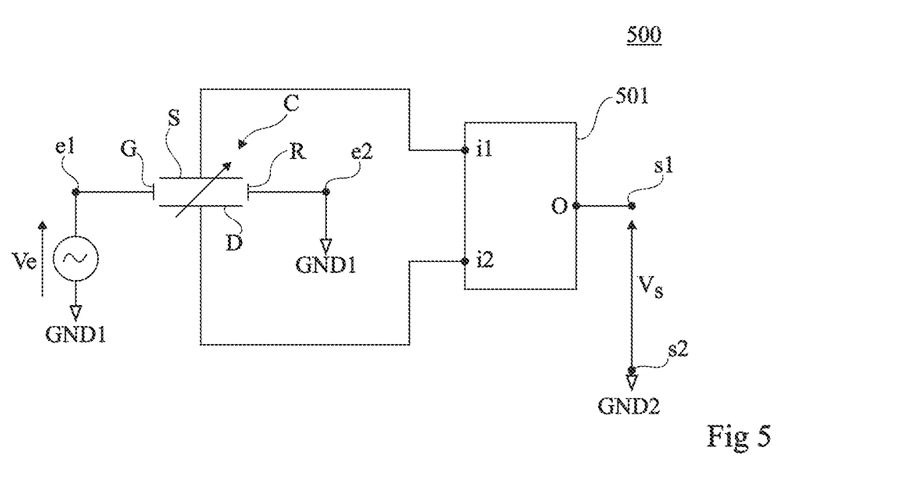
FIG. 5 is an electric diagram of another example of a galvanic isolation coupling device according to an embodiment.

FIG. 5 is an electric diagram of another example of a galvanic isolation coupling device 500 according to an embodiment.

The device of FIG. 5 comprises an electrostatically actuated variable-capacitance capacitor with four electrodes C, for example, a capacitor of the type described in relation with FIG. 2.

The coupling device of FIG. 5 is capable of receiving an AC input voltage Ve applied between input terminals e1 and e2 of the device, and of supplying an AC output voltage Vs having a frequency fVs which is an image of voltage Ve, between output terminals s1 and s2 of the device. It should be noted that in the example of FIG. 5, input voltage Ve may be a DC voltage or an AC voltage, which is a difference with the coupling device of FIG. 4 which only enables to transmit AC signals.

As in the example of FIG. 4, input terminals e1 and e2 are galvanically isolated from output terminals s1 and s2. As an example, voltage Ve is supplied by a first electric or electronic circuit (not shown in the drawing) connected to input terminals e1 and e2 of the coupling device, and voltage Vs is applied to a second electric or electronic circuit (not shown in the drawing) connected to the output terminals of the coupling device, no conductive connection being provided between the first and second circuits. As an example, the first and second circuits are powered with voltages of different levels and have different reference terminals or grounds.

In this example, input terminals e1 and e2 of the coupling device are respectively connected to electrodes G and R of capacitor C. As an example, terminal e2 is connected to a terminal GND1 of application of a reference potential of the first circuit, for example, the ground of the first circuit, the input voltage Ve delivered by the first circuit being referenced to terminal GND1.

The coupling device of FIG. 5 comprises an oscillator 501, for example, a relaxation oscillator, having two input terminals i1 and i2 respectively connected to main electrodes S and D of capacitor C. Oscillator 501 uses capacitance CSD to oscillate and supplies, on an output terminal o connected to output terminal s1 of the coupling device, a periodic AC voltage Vs having a frequency fVs which is a function of the value of capacitance CSD, and accordingly of the value of input voltage Ve of the coupling device. In this example, voltage Vs is referenced to a terminal GND2 of application of a reference potential of the second circuit, for example, the ground of the second circuit, output terminal s2 of the coupling device being connected to terminal GND2.

Figure 6:
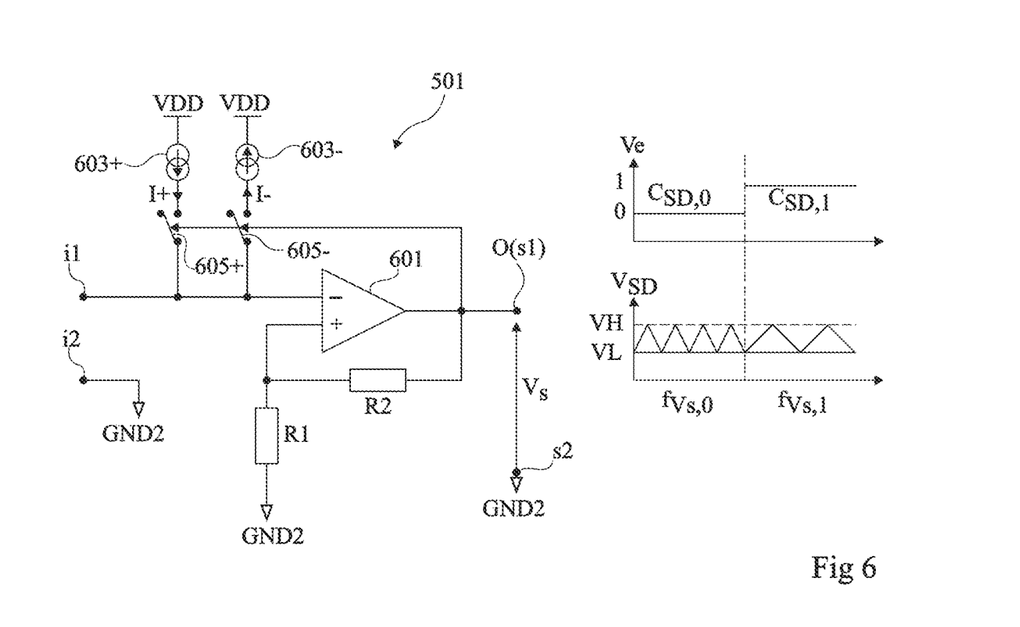
FIG. 6 is an electric diagram illustrating in further detail an embodiment of an oscillator of the galvanic isolation coupling device of FIG. 5.

FIG. 6 is an electric diagram illustrating in further detail an embodiment of oscillator 501 of the galvanic isolation coupling device of FIG. 5. FIG. 6 further comprises, in its right-hand portion, a timing diagram illustrating the operation of oscillator 501.

Oscillator 501 of FIG. 6 comprises an operational amplifier 601 having a negative input terminal (−) connected to terminal i1 of the oscillator, intended to be connected to electrode S of capacitor C. Terminal i2 of the oscillator, intended to be connected to electrode D of capacitor C, is connected to reference terminal GND2. Oscillator 501 further comprises a resistor R1 coupling a positive input terminal (+) of amplifier 601 to reference terminal GND2, and a resistor R2 coupling the positive input terminal (+) of amplifier 601 to an output terminal of amplifier 601. More particularly, in the shown example, resistor R1 has a first end connected to the positive input terminal (+) of amplifier 601 and a second end connected to terminal GND2, and resistor R2 has a first end connected to the positive input terminal (+) of amplifier 601 and a second end connected to the output terminal of amplifier 601. The output terminal of amplifier 601 is connected to output terminal o of the oscillator. Oscillator 501 of FIG. 6 further comprises a first current source 603+ coupled to terminal i1 by a switch 605+, and a second current source 603− coupled to terminal i1 by a switch 605−. Current source 603+ supplies a constant current I+ having a first biasing, capable of charging capacitor CSD when switch 605+ is on. Current source 603− supplies a constant current I− having an opposite biasing, for example, having the same intensity as current I+, capable of discharging capacitor CSD when switch 605− is on. Switches 605+ and 605− are controlled in phase opposition according to the output signal of amplifier 601.

As an illustration, it is here considered that the input signal of the coupling device is a binary signal, that is, voltage Ve may take one or the other of two high and low values, respectively corresponding to binary value '1' and to binary value '0'. Thus, capacitance CSD of capacitor C may take one or the other of two values CSD,1 and CSD,0, respectively corresponding to the high state and to the low state of voltage Ve. In the considered example, capacitor C is a capacitor having a positive capacitance variation, that is, capacitance CSD,1 is greater than capacitance CSD,0. The described embodiments may however easily be adapted to the case where capacitor C is a capacitor having a negative capacitance variation.

Amplifier 601 behaves as a hysteresis comparator controlling the charge or the discharge of capacitor CSD by constant current sources 603+ and 603−. More particularly, when switches 605+ and 605− are respectively on and off, capacitor CSD charges under the effect of current I+ supplied by current source 603+. When voltage VSD reaches a high threshold VH set, in particular, by the values of resistances R1 and R2, the output signal switches state, causing the turning off of switch 605+ and the turning on of switch 605−. Capacitor CSD then discharges under the effect of current I− supplied by current source 603−. When voltage VSD reaches a low threshold VL set, in particular, by the values of resistances R1 and R2, the output signal switches state, causing the turning on of switch 605+ and the turning off of switch 605−. Currents I+ and I− being constant, the oscillation frequency fVs of the output signal of amplifier 601 is a function of the value of capacitance CSD, and thus of the value of input voltage Ve. More particularly, in this example, the frequency of the output signal of the oscillator has a first value fVs,0 when voltage Ve is in the low state, and a second value fVs,1 smaller than the first value when voltage Ve is in the high state.

Output voltage Vs of the coupling device thus is a frequency-coded image of input voltage Ve. The galvanic isolation is ensured by the variable-capacitance capacitor with four electrodes, particularly via the insulating region separating electrode D from electrode R (element 201 of the mobile assembly in the example of FIG. 2).

It should be noted that the embodiment of FIGS. 5 and 6 is not limited to the shown example where input voltage Ve is a binary signal, but may be adapted to the case where input voltage Ve is an analog signal which is continuously variable or variable by steps with a number of steps greater than two.

Figure 7:
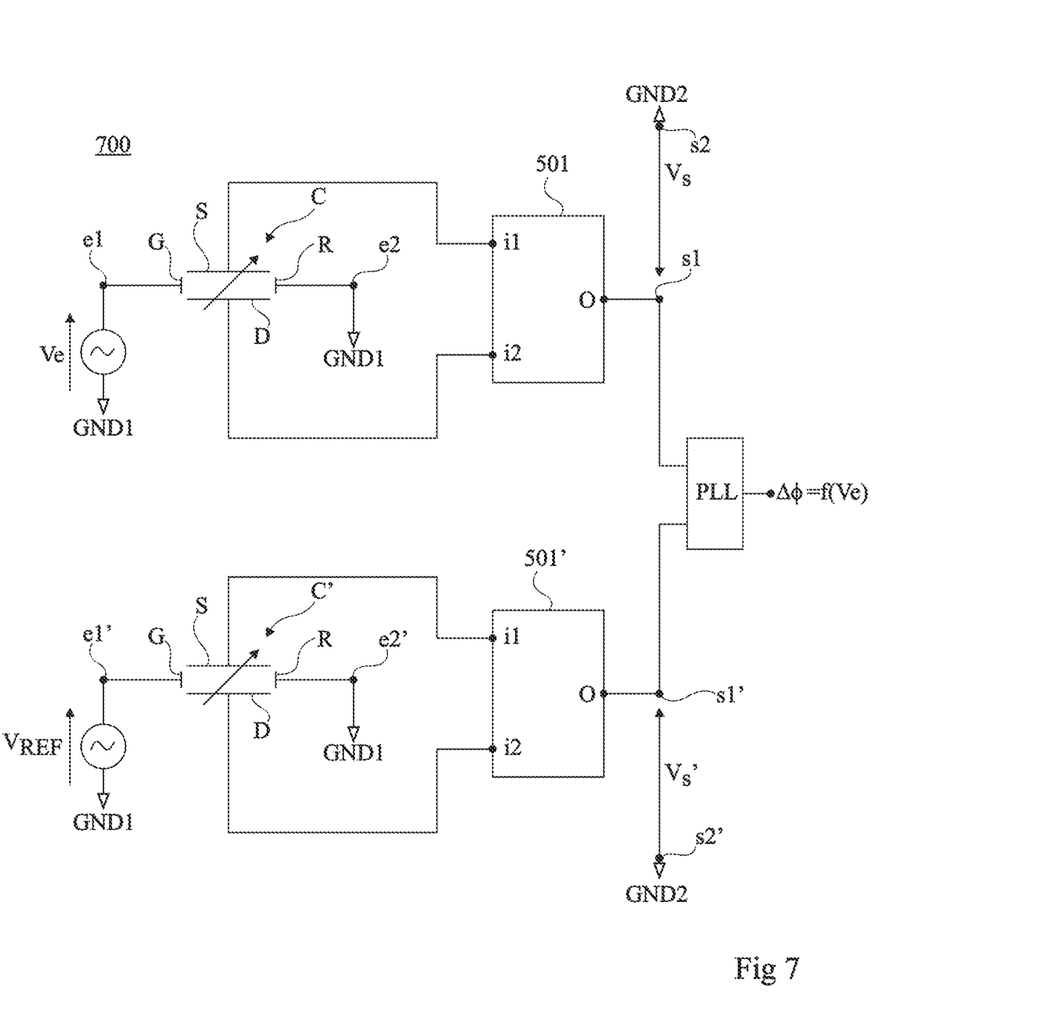
FIG. 7 is an electric diagram of another example of a galvanic isolation coupling device according to an embodiment.

FIG. 7 is an electric diagram illustrating a differential alternative embodiment of the galvanic isolation coupling device of FIG. 5.

The coupling device 700 of FIG. 7 comprises the same elements as the coupling device of FIG. 5, arranged substantially in the same way.

The coupling device of FIG. 7 further comprises a second electrostatically actuated variable-capacitance capacitor with four electrodes C', for example, identical or similar to capacitor C.

The coupling device of FIG. 7 further comprises a voltage source 701 capable of receiving a reference voltage VREF, for example, a DC voltage of constant value, applied between input terminals e1' and e2' of the device, respectively connected to electrodes G and R of capacitor C', and of supplying an AC output voltage Vs' of frequency fVs' representative of the value of reference voltage VREF, between terminals s1' and s2'. Input terminals e1' and e2' are galvanically isolated from terminals s1' and s2' on the one hand, and from terminals s1 and s2 on the other hand. In this example, terminal s2' of the coupling device is connected to terminal GND2.

To generate voltage Vs', the coupling device of FIG. 7 comprises a second oscillator 501', identical or similar to oscillator 501, having terminals i1 and i2 respectively connected to electrodes S and D of capacitor C', and having its output terminal o connected to terminal s1'.

The coupling device of FIG. 7 further comprises a phase-locked loop PLL receiving as an input voltages Vs and Vs' and supplying an output signal Δϕ representative of the frequency difference between signals Vs and Vs', and thus of the value of input voltage Ve.

In this example, signal Δϕ forms the output signal of the coupling device.

An advantage of the coupling device of FIG. 7 is that it is less sensitive to possible parasitic dispersions than the coupling device of FIG. 5. In particular, in the example of FIG. 7, output signal Δϕ is independent from possible fluctuations of the reference potentials present on terminals GND1 and GND2 of the input and output circuits of the coupling device.

Specific embodiments have been described. Various alterations, modifications, and improvements will occur to those skilled in the art. In particular, although examples of coupling devices of FIGS. 4, 5, 6, and 7 are made up of electrostatically actuated variable-capacitance capacitors with four electrodes, it will be within the abilities of those skilled in the art to adapt these examples to form a coupling device from an electromagnetically actuated variable-capacitance capacitors with four electrodes, for example, a capacitor of the type described in relation with FIG. 3.

Further, it will be within the abilities of those skilled in the art to adapt the described examples to form a coupling device from a piezoelectrically actuated variable-capacitor with four electrodes.

Further, the described embodiments are not limited to the examples of coupling devices described in relation with FIGS. 4, 5, 6, and 7. More generally, it will be within the abilities of those skilled in the art to provide other circuits based on an electrostatically or electromechanically actuated variable-capacitance capacitor with four electrodes to form a galvanic isolation coupling device.

It should further be noted that although the examples described in relation with FIGS. 4, 5, 6, and 7 only correspond to coupling devices capable of transmitting control signals between two circuits, the described embodiments are not limited to this specific case. It will be within the abilities of those skilled in the art to provide galvanic isolation coupling devices made up of electrostatically or electromagnetically actuated variable-capacitance capacitors with four electrodes enabling to transfer electric power between two circuits.

Further, although the examples described in relation with FIGS. 4, 5, 6, 7, and 8 correspond to one-way coupling devices, the described embodiments are not limited to this specific case. As a variation, it will be within the abilities of those skilled in the art to provide bidirectional galvanic isolation coupling devices made up of electrostatically, electromagnetically, or piezoelectrically actuated variable-capacitance capacitors with four electrodes. It should in particular be noted that in the example of FIG. 2, the voltage applied between main electrodes S and D of capacitor C influences the value of the capacitance between control electrodes G and R of the capacitor, which enables to implement a bidirectional coupling.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A system comprising first and second electric or electronic circuits galvanically isolated from each other, and a coupling device coupling the first circuit to the second circuit, the coupling device comprising a variable-capacitance capacitor comprising first and second electrodes mobile with respect to each other, separated by an insulating region, and third and fourth electrodes electrically insulated from the first and second electrodes, capable of receiving a control signal to vary, by an electrostatic, electromagnetic, or piezoelectric actuation mechanism, the relative position of the first and second electrodes, to vary the capacitance between the first and second electrodes, wherein the coupling device comprises first and second input terminals connected to the first circuit and capable of receiving an input signal originating from the first circuit, and first and second output terminals connected to the second circuit and galvanically isolated from the first and second input terminals, capable of supplying the second circuit with an output signal which is an image of the input signal, wherein the first and second input terminals are respectively connected to the third and fourth electrodes of the capacitor, and wherein the first and second output terminals are coupled to the first and second electrodes of the capacitor so that the output signal varies according to the value of the capacitance between the first and second electrodes.

2. The system of claim 1, wherein the input signal is an AC signal, the coupling device comprising a circuit capable of applying a constant voltage between the first and second electrodes of the capacitor, and of supplying a voltage proportional to the current generated on the second electrode of the capacitor due to the variations of the capacitance between the first and second electrodes of the capacitor.

3. The system of claim 2, wherein said circuit of the coupling device comprises:
   a voltage source capable of applying a first constant DC voltage onto the first electrode of the capacitor;
   an operational amplifier having its negative input connected to the second electrode of the capacitor;
   a voltage source capable of applying a second constant DC voltage onto the positive input of the operational amplifier; and
   a resistor coupling the negative input of the operational amplifier to the output of the operational amplifier.

4. The system of claim 1, wherein the input signal is an AC or DC signal, the coupling device comprising an oscillator capable of supplying a voltage having a frequency which is a function of the value of the capacitance between the first and second electrodes of the capacitor.

5. The system of claim 4, wherein the oscillator comprises a hysteresis comparator arranged to compare the voltage between the first and electrodes of the capacitor with a first threshold and with a second threshold lower than the first threshold, and to order the application of a constant discharge current between the first and second electrodes of the capacitor when said voltage reaches the first threshold, and the application of a constant charge current between the first and second electrodes of the capacitor when said voltage reaches the second threshold.

6. The system of claim 4, wherein the coupling device further comprises:
   an additional variable-capacitance capacitor comprising first and second electrodes mobile with respect to each other, separated by an insulating region, and third and fourth electrodes electrically insulated from the first and second electrodes, capable of receiving a control signal to vary, by an electrostatic, electromagnetic, or piezoelectric actuation mechanism, the relative position of the first and second electrodes to vary the capacitance between its first and second electrodes;
   a voltage source capable of applying a DC reference voltage between the third and fourth electrodes of the additional capacitor;
   an additional oscillator capable of supplying a voltage having a frequency which is a function of the value of the capacitance between the first and second electrodes of the additional capacitor; and
   a phase-locked loop capable of supplying a signal representative of the frequency difference between the voltage supplied by the oscillator and the voltage supplied by the additional oscillator.

7. The system of claim 1, wherein the first circuit is powered under a voltage which is at least ten times smaller or at least ten times greater than that of the second circuit.

8. The system of claim 1, wherein the first, second, third, and fourth electrodes of the capacitor are coated with a layer of an insulating material.

9. The device of claim 8, wherein said insulating material is parylene.

\* \* \* \* \*